US011367730B2

(12) United States Patent
Ramaswamy (10) Patent No.: US 11,367,730 B2
(45) Date of Patent: *Jun. 21, 2022

(54) CELL DISTURB PREVENTION USING A LEAKER DEVICE TO REDUCE EXCESS CHARGE FROM AN ELECTRONIC DEVICE

(71) Applicant: Micron Technology, Inc., Boise, ID (US)

(72) Inventor: Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/008,262

(22) Filed: Aug. 31, 2020

(65) Prior Publication Data

US 2020/0395368 A1 Dec. 17, 2020

Related U.S. Application Data

(63) Continuation of application No. 16/228,072, filed on Dec. 20, 2018, now Pat. No. 10,777,563, which is a
(Continued)

(51) Int. Cl.
*G11C 16/04* (2006.01)
*H01L 27/11507* (2017.01)
(Continued)

(52) U.S. Cl.
CPC ...... *H01L 27/11507* (2013.01); *G11C 11/221* (2013.01); *G11C 11/2259* (2013.01);
(Continued)

(58) Field of Classification Search
CPC .............. G11C 11/221; G11C 11/2259; G11C 11/2295; H01L 27/11507; H01L 27/11504; H01L 27/11509; H01L 28/20; H01L 28/55
See application file for complete search history.

(56) References Cited

U.S. PATENT DOCUMENTS 5,132,936 A 7/1992 Keswick et al.
5,321,655 A 6/1994 Iwahashi et al.
(Continued)

FOREIGN PATENT DOCUMENTS

CN 110024034 A 7/2019
DE 102014105639 B3 3/2015
(Continued)

OTHER PUBLICATIONS

"International Application Serial No. PCT/US2017/059319, International Preliminary Report on Patentability dated May 16, 2019", 8 pgs.
(Continued)

*Primary Examiner* — Pho M Luu
(74) *Attorney, Agent, or Firm* — Schwegman Lundberg & Woessner, P.A.

(57) ABSTRACT

An example of an apparatus includes a plurality of memory cells. At least a portion of the memory cells have a bottom electrode with each bottom electrode being at least partially electrically isolated from remaining ones of the bottom electrodes. At least one resistive interconnect electrically couples two or more of the bottom electrodes. The resistive interconnect is arranged to discharge at least a portion of excess charge from the two or more bottom electrodes. Additional apparatuses and methods of forming the apparatuses are disclosed.

20 Claims, 7 Drawing Sheets

Related U.S. Application Data continuation of application No. 15/340,682, filed on Nov. 1, 2016, now Pat. No. 10,163,917.

(51) Int. Cl.

| | | |
|---|---|---|
| *G11C 11/22* | (2006.01) | |
| *H01L 27/11504* | (2017.01) | |
| *H01L 27/11509* | (2017.01) | |
| *H01L 27/01* | (2006.01) | |
| *H01L 49/02* | (2006.01) | |

(52) U.S. Cl.
CPC .... *G11C 11/2295* (2013.01); *H01L 27/11504* (2013.01); *H01L 27/11509* (2013.01); *H01L 27/016* (2013.01); *H01L 28/20* (2013.01); *H01L 28/55* (2013.01)

(56) References Cited

U.S. PATENT DOCUMENTS

| | | | |
|---|---|---|---|
| 6,441,423 B1 | 8/2002 | Mandelman et al. | |
| 7,864,558 B2* | 1/2011 | Krieger | G11C 11/22 365/145 |
| 8,934,296 B2* | 1/2015 | Widjaja | H01Q 1/2283 365/177 |
| 10,163,917 B2* | 12/2018 | Ramaswamy | G11C 11/221 |
| 10,777,563 B2* | 9/2020 | Ramaswamy | H01L 27/11509 |
| 2004/0004880 A1 | 1/2004 | Yoon et al. | |
| 2011/0163232 A1 | 7/2011 | Yamamura | |
| 2016/0064391 A1 | 3/2016 | Li et al. | |
| 2017/0025552 A1 | 1/2017 | Schmidt et al. | |
| 2017/0069932 A1 | 3/2017 | Sweeney et al. | |
| 2018/0122816 A1 | 5/2018 | Ramaswamy | |
| 2019/0198512 A1 | 6/2019 | Ramaswamy | |

FOREIGN PATENT DOCUMENTS

| | | |
|---|---|---|
| EP | 1189235 A1 | 3/2002 |
| TW | 201818402 A | 5/2018 |
| TW | I670724 B | 9/2019 |
| WO | WO-2018085279 A1 | 5/2018 |

OTHER PUBLICATIONS

"International Application Serial No. PCT/US2017/059319, International Search Report dated Feb. 8, 2018", 3 pgs.

"International Application Serial No. PCT/US2017/059319, Written Opinion dated Feb. 8, 2018", 6 pgs.

"Taiwanese Application Serial No. 106135502, Office Action dated Aug. 23, 2018", W/ English Translation w/ English Claims, 16 pgs.

"Taiwanese Application Serial No. 106135502, Response filed Nov. 8, 2018 to Office Action dated Aug. 23, 2018", w/English Translation, 5 pgs.

"Taiwanese Application Serial No. 106135502, Translation filed Jan. 11, 2018", w/Amended Specifications and Claims, 83 pgs.

"Taiwanese Application Serial No. 106135502, Voluntary Amendment Filed May 22, 2019", w/English Claims, 24 pgs.

U.S. Appl. No. 15/340,682, U.S. Appl. No. 10/163,917, filed Nov. 1, 2016, Cell Disturb Prevention Using a Leaker Device to Reduce Excess Charge From an Electronic Device.

U.S. Appl. No. 16/228,072, U.S. Appl. No. 10/777,563, filed Dec. 20, 2018, Cell Disturb Prevention Using a Leaker Device to Reduce Excess Charge From an Electronic Device.

U.S. Appl. No. 15/340,682, Non Final Office Action dated Mar. 8, 2018, 13 pgs.

U.S. Appl. No. 15/340,682, Response filed Jun. 18, 2018 to Non Final Office Action dated Mar. 8, 2018, 10 pgs.

U.S. Appl. No. 15/340,682, Notice of Allowance dated Sep. 26, 2018, 5 pgs.

U.S. Appl. No. 16/228,072, Preliminary Amendment filed Mar. 15, 2019, 6 pgs.

U.S. Appl. No. 16/228,072, Non Final Office Action dated Dec. 20, 2019, 22 pgs.

U.S. Appl. No. 16/228,072, Response filed Apr. 20, 2020 to Non Final Office dated Dec. 20, 2019, 10 pgs.

U.S. Appl. No. 16/228,072, Notice of Allowance dated May 4, 2020, 7 pgs.

\* cited by examiner

CELL DISTURB PREVENTION USING A LEAKER DEVICE TO REDUCE EXCESS CHARGE FROM AN ELECTRONIC DEVICE

PRIORITY APPLICATION

This application is a continuation of U.S. application Ser. No. 16/228,072, filed Dec. 20, 2018, now issued as U.S. Pat. No. 10,777,563, which is a continuation of U.S. application Ser. No. 15/340,682, filed Nov. 1, 2016, now issued as U.S. Pat. No. 10,163,917, all of which are incorporated herein by reference in their entirety.

BACKGROUND

Computers and other electronic systems, for example, digital televisions, digital cameras, and cellular phones, often have one or more memory devices to store information. Increasingly, memory devices are being reduced in size to achieve a higher density of storage capacity. Even when increased density is achieved, consumers often demand that memory devices also use less power while maintaining high speed access and reliability of data stored on the memory devices.

DETAILED DESCRIPTION

The description that follows includes illustrative apparatuses (circuitry, devices, structures, systems, and the like) and methods (e.g., processes, sequences, techniques, and technologies) that embody the subject matter. In the following description, for purposes of explanation, numerous specific details are set forth in order to provide an understanding of various embodiments of the subject matter. After reading this disclosure, it will be evident to those of ordinary skill in the art however, that various embodiments of the subject matter may be practiced without these specific details. Further, well-known apparatuses and methods have not been shown in detail so as not to obscure the description of various embodiments. Moreover, as understood by a person of ordinary skill in the art, relative terms that may be employed herein (for example, top, bottom, upper, lower, etc.) are used merely to convey the general concepts disclosed and should not be considered as absolute terms. For example, a "bottom" node may actually be formed over a memory cell depending on the actual fabrication sequences employed.

Many, if not most, primary memory cell disturb mechanisms are due to a build of potential at cell bottom (CB) electrode nodes. As discussed in more detail below, this disturb mechanism is applicable for ferroelectric RAM (FERAM) However, other types of electronic devices may benefit from the disclosed subject matter as well.

In an embodiment, each of the memory cells in a memory array can be programmed to one of two data states to represent a binary value of "0" or "1" in a single bit. Such a cell is sometimes called a single-level cell (SLC). Various operations on these types of cells are independently known in the semiconductor and related arts.

Regardless of the memory cell arrangement, the primary disturb mechanisms discussed above can arise due to different factors. For example, charge on the cell bottom-node can rise due to factors such as plate glitch, access transistor leakage, cell-to-cell interactions, or other factors. If a dielectric material in a memory cell leaks significantly, the state of the cell may adversely be affected.

In various embodiments described herein, a bottom-node leaker device (or leaker device, irrespective of location) is electrically coupled to one or more of the CB electrode nodes, thereby draining off excess charge from the CB electrode nodes (e.g., internal nodes of the memory device). The bottom-node leaker device may further be electrically coupled to a substrate upon which the memory cells are formed. Consequently, the bottom-node leaker device is introduced into a memory array to prevent build-up of potential at bottom nodes of the individual memory cells as discussed in more detail, below.

Figure 1A:
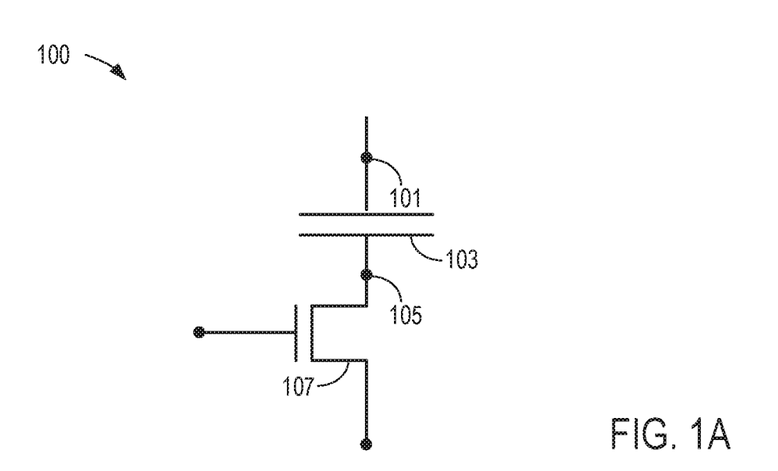
FIG. 1A is an electrical schematic of a memory device having a single access device electrically coupled to a bottom electrode, according to an embodiment.

Referring now to FIG. 1A, an electrical schematic of a memory device 100 based on a capacitor is shown. The memory device 100 is shown to include a top electrode 101, a capacitor 103, an access device 107, and a cell bottom-node 105 electrically coupled between capacitor 103 and the access device 107 This type of memory device 100 is often referred to as a one-transistor, one-capacitor (1T1C) device.

The access device 107 may comprise, for example, various types of transistors, including thin film transistors, or other switching devices (e.g., an ovonic threshold switch (OTS), tunneling diode, or others) known in the art. The capacitor 103 may comprise various types of electrode plates formed proximate to or around a dielectric material and a ferroelectric material as known in the art and discussed in more detail below.

Figure 1B:
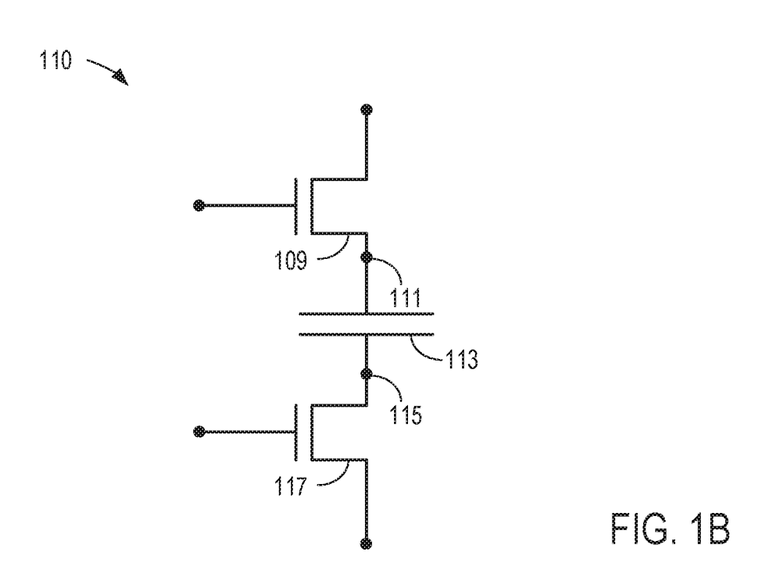
FIG. 1B is an electrical schematic of a memory device having two access devices with a first access device electrically coupled to a bottom electrode and a second access device electrically coupled to a top electrode, according to an embodiment.

FIG. 1B shows an electrical schematic of a memory device 110 having two access devices. The memory device 110 is shown to include a first access device 109 coupled to a top node 111 and a capacitor 113. The capacitor, in turn, is coupled to a cell bottom-node 115 and a second access device 117. Each of the first access device 109 and the second access device 117 may be the same as or similar to the access device 107 of FIG. 1A. Further, the capacitor 113 may be the same as or similar to the capacitor 103 of FIG. 1A. As shown, the memory device 110 is often referred to as a two-transistor, one-capacitor (2T1C) device In the memory cells 100, 110 of either FIG. 1A or FIG. 1B, during a fast access of the cells, the various pull-up and pull-down cycles (accomplished by selecting various ones of the access devices 107, 109, 117 as needed) used to store a given binary state in the ferroelectric material can cause excess charge to be built up on the cell bottom-node 105, 115. The excess charge can disturb both the cell undergoing the charge/discharge cycles, as well as potentially disturbing adjacent memory cells. These processes are better understood with reference to FIGS. 2A through 4 as discussed below.

Figure 2A:
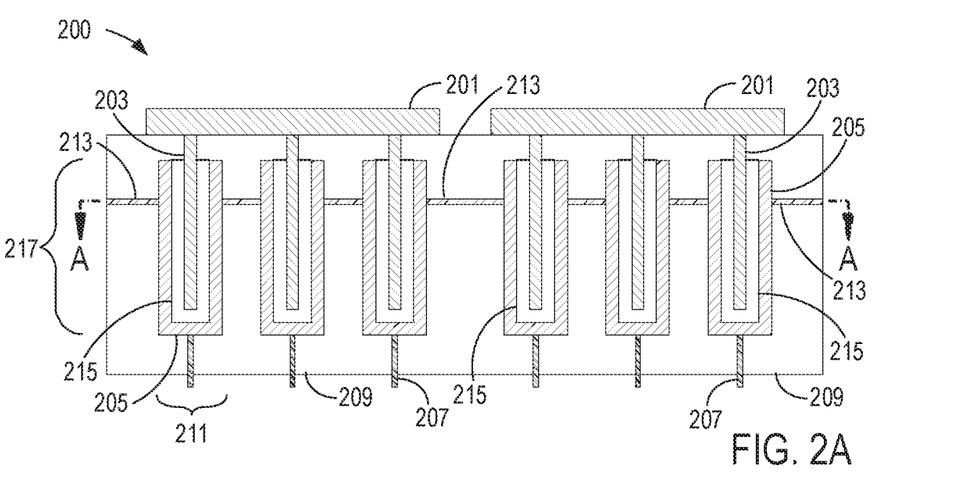
FIG. 2A is an embodiment of a cross-sectional view of a portion of a memory array, showing a first position of a bottom-node leaker device.

Referring now to FIG. 2A, an embodiment of a cross-sectional view 200 of a portion of a memory array is shown. The cross-sectional view 200 of the portion of the memory array is shown to include an electrode plate 201, a top electrode 203, a bottom electrode 205, and a cell bottom-node electrode 207. A memory cell material 215 is formed substantially within a cavity formed between the top electrode 203 and the bottom electrode 205. As shown, each memory cell 211 comprises the top electrode 203, the bottom electrode 205, and the memory cell material 215.

Individual ones of the plurality of memory cells 211 are separated (e.g., at least partially electrically isolated) from one another and are surrounded by a first dielectric material 209. In one embodiment, the first dielectric material 209 may comprise various types of dielectric material such as, for example, silicon dioxide ($SiO_2$) to at least partially electrically isolate the memory cells 211 from each other. However, a person of ordinary skill in the art, upon reading the disclosure provided herein, will recognize that materials other than silicon dioxide or other various types of insulating materials may be used to form the first dielectric material 209. For example, various types of dielectric materials, such as silicon nitride ($Si_xN_y$) or a variety of other dielectric or ceramic materials may be used as an alternative to or in conjunction with the silicon dioxide or other type of dielectric or insulating material.

In one embodiment, the memory cell material 215 comprises a ferroelectric material, such as lead zirconate titanate (PZT). In other embodiments, the dielectric component of the memory cell material may comprise $HfO_2$, $ZrO_2$, $Hf_xZr_yO$, $NbO_x$, $AlO_x$, $LaO_x$, $SrTiO_3$, $SrO$, $HfSiO_x$, $HfAlO_x$ or combinations of these and other dielectric materials. Thus, the dielectric component of the memory cell material 215 may or may not be comprised of the same material as the first dielectric material 209.

The first dielectric material 209 and the plurality of memory cells 211 are formed over a substrate (not shown but readily understood by the skilled artisan). In various embodiments, the substrate can include, for example, any of various types of substrates used in the semiconductor and allied industries (which may be referred to herein as "semiconductor substrates" or simply "substrates"). Substrate types may therefore include silicon substrates (e.g., wafers) or substrates based on other elemental semiconductors, compound wafers (e.g., from Groups III-V, II-VI, or others), thin film head assemblies, polyethylene-terephthalate (PET) films deposited or otherwise formed with a semiconducting layer, or numerous other types of substrates known independently in the art. Also, the substrate may comprise a region of a semiconductor material formed over a non-semiconductor material, or vice-versa. For ease of understanding the fabrication activities presented herein, the substrate may be considered to be a silicon wafer. Upon reading and understanding the disclosure provided herein, a person of ordinary skill in the art will understand how to modify various memory cell fabrication activities to account for other types of materials and electronic devices.

Each of the cell bottom-node electrodes 207 is coupled to an access transistor (not shown but similar in concept to the access transistors 107, 109, 117 of FIGS. 1A and 1B). Further, the skilled artisan will recognize that the memory cell of FIG. 2A may be readily modified to have a plurality of 2T1C structures, similar to the electrical schematic of FIG. 1B.

FIG. 2A is further shown to include a bottom-node leaker 213. Although only a single leaker is shown, additional leakers may be added as discussed in more detail, below. The bottom-node leaker 213 may electrically couple either some or all of the memory cells 211. An electrical resistance of the bottom-node leaker 213 can be tailored to remove excess charge from the memory cells 211, while not electrically shorting the bottom electrodes 205. Therefore, the bottom-node leaker is a resistive interconnect. If the bottom-node leaker is too leaky, then one or more of the memory cells may experience cell-to-cell disturb. If the bottom-node leaker is not leaky (conductive) enough, then excess charge will not be drained, the person of ordinary skill in the art will recognize how to calculate the resistance needed for the bottom-node leaker 213 for a given memory array. For example, the resistance of the bottom-node leaker 213 may be selected to be from about 0.1 MΩ (megohms) to about 5 MΩ. Factors such as separation between adjacent memory cells, the dielectric material used between the cells, physical dimensions (e.g., an overall height 217 of the bottom electrode 205), the amount of charge placed in the cells, a size of the memory array and frequency of operations, and so on may be considered when making a determination of the resistance needed for the bottom-node leaker 213.

A physical cross-section of the bottom-node leaker and a material or materials selected to form the bottom-node leaker 213 each are factors to be considered in forming the bottom-node leaker 213. For example, the bottom-node leaker 213 can be formed from materials such as amorphous silicon (α-Si at, e.g., about 20 Å to about 100 Å in thickness), niobium monoxide ($NbO_x$ at, e.g., about 2 Å to about 3 Å in thickness), leaky silicon-rich silicon nitride ($Si_xN_y$ at, e.g., about 30 Å to about 500 Å in thickness), or combinations thereof, or other materials known independently in the art. Each of these materials may be formed or otherwise deposited by using a variety of formation or deposition process tools (e.g., physical vapor deposition (PVD), chemical vapor deposition (CVD), plasma-enhanced CVD (PECVD), atomic level deposition (ALD), etc.).

Figure 3A:
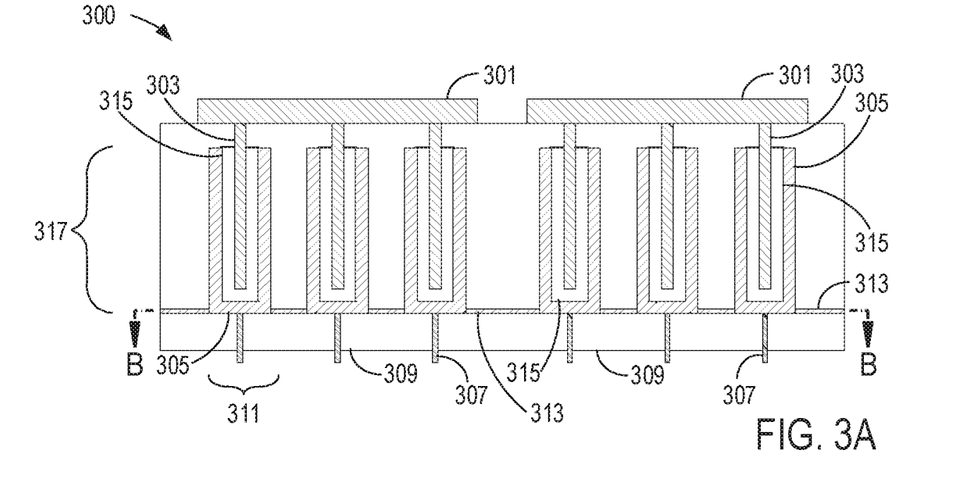
FIG. 3A is an embodiment of a cross-sectional view of a portion of a memory array, showing an alternate position of the bottom-node leaker device.

The bottom-node leaker 213 can be placed anywhere along the overall height 217 of the bottom electrode 205. The placement of the bottom-node leaker 213 may be selected based on particular process steps or other factors. For example, the bottom-node leaker 213 may be placed as shown in FIG. 2A near, but not at, an upper portion of the bottom electrode 205. In this embodiment, the skilled artisan will recognize that portions of the bottom-node leaker 213 may be stripped as needed using an inverse mask, known independently in the semiconductor art. In other embodiments, the bottom-node leaker 213 may be placed at the top of the bottom electrode 205 to avoid using an inverse mask. FIG. 3A, discussed below, provides an example of an alternate placement of the bottom-node leaker 213.

Figure 2B:
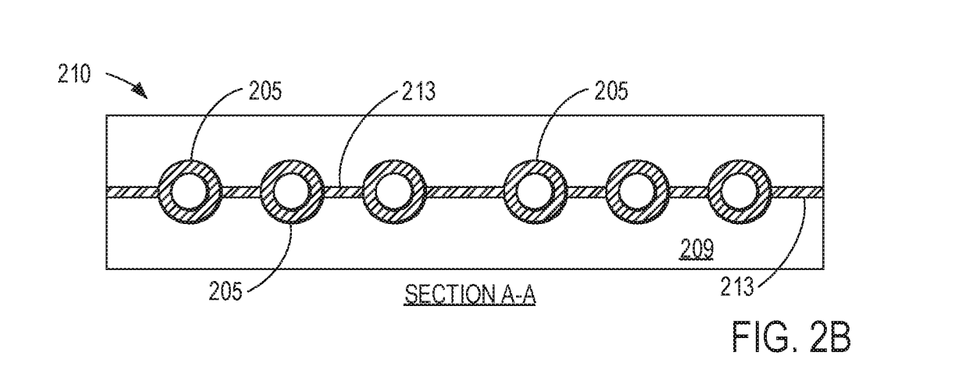
FIGS. 2B and 2C show plan views of various embodiments of alternate arrangements of the bottom-node leaker device of FIG. 2A.
Figure 2C:
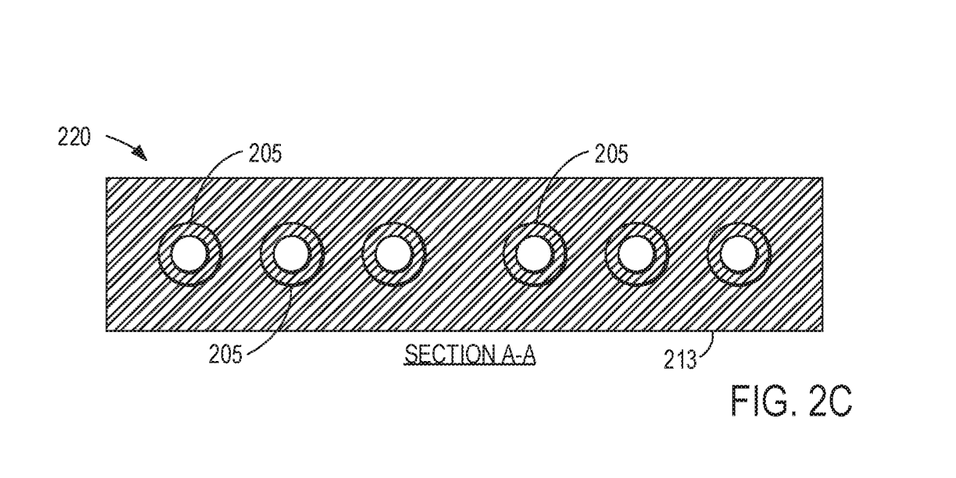
Figure 3B:
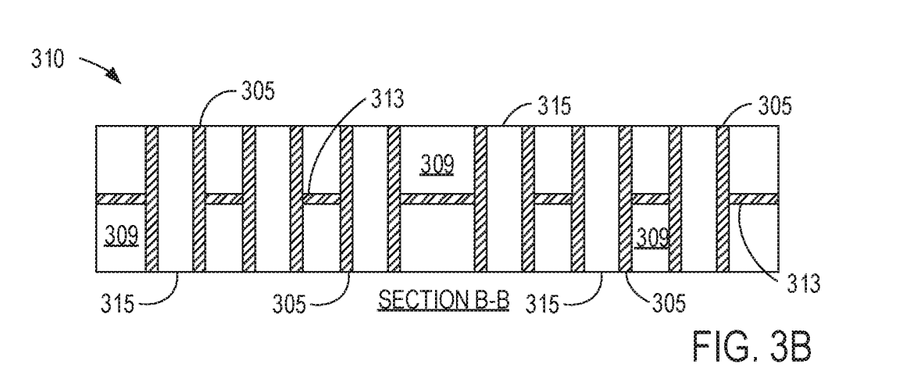
FIGS. 3B and 3C show plan views of various embodiments of alternate arrangements of the bottom-node leaker device of FIG. 3A.
Figure 3C:
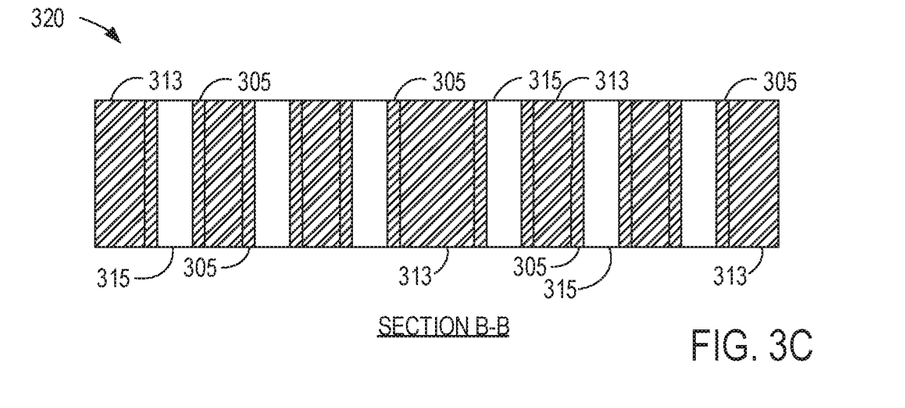

FIGS. 2B and 2C shows plan views, at Section A-A. of various embodiments of alternate arrangements of the bottom-node leaker device 213 of FIG. 2A. Note that neither FIG. 2B nor FIG. 2C show the top electrode 203, which is not shown merely to prevent obscuring the various examples of formation arrangements of the bottom-node leaker 213. As will be evident to the skilled artisan, the memory cells 211 in this embodiment are formed in a plurality of vias. However, such an arrangement is not required and the memory cells 211 may be formed in trenches or in a variety of other ways as is known independently in the semiconductor arts. For example, as described in detail below. FIGS. 3A through 3C describe another embodiment in which the memory cells are, alternatively, formed in a trench.

In a first arrangement 210 of the bottom-node leaker 213, each of the memory cells is shown coupled by a single "line" of material forming the bottom-node leaker 213. Although shown as a single line coupling the memory cells 213, the skilled artisan will recognize, based on reading and understanding the inventive subject matter disclosed herein, that multiple lines of material may be used. Further, the lines need not be formed near the central portion of the memory cells 211 but may be formed at other locations (e.g., such as formed to couple to an outside edge of the memory cells 211). Additionally, as discussed above, not all of the memory cells 211 need to be coupled to each other; only selected ones of the memory cells 211 may be selected to be electrically coupled to the bottom-leaker node 213.

In a second arrangement 220 of the bottom-node leaker 213, each of the memory cells is shown coupled by one more layers of material forming the bottom-node leaker 213. Although shown as a single layer coupling the memory cells 213, the skilled artisan will recognize, based on reading and understanding the inventive subject matter disclosed herein, that multiple layers of material may be used, with each of the multiple layers of material being separated from each other by a dielectric material layer. Each of the layers may comprise the same or different materials from the example materials or other materials discussed above. Further, as discussed above, not all of the memory cells 211 need to be coupled to each other; only selected ones of the memory cells 211 may be selected to be electrically coupled to the bottom-leaker node 213.

In FIG. 3A, an embodiment of a cross-sectional view 300 of a portion of a memory array is shown. The cross-sectional view 300 of the portion of the memory array is shown to include an electrode plate 301, a top electrode 303, a bottom electrode 305, and a cell bottom-node electrode 307. A memory cell material 315 is formed substantially within a cavity formed between the top electrode 303 and the bottom electrode 305. As shown, each memory cell 311 comprises the top electrode 303, the bottom electrode 305, and the memory cell material 315.

FIG. 3A is further shown to include a bottom-node leaker 313. In the embodiment of FIG. 3A, the bottom-node leaker is located at or near the bottom edge of the bottom electrode 305. However, as with FIG. 2A, the bottom-node leaker 313 may be placed anywhere along an overall height 317 of the bottom electrode 305. The bottom-node leaker 313 of FIG. 3A also may electrically couple either some or all of the memory cells 311. Also, as with FIG. 2A, the placement of the bottom-node leaker 213 may be selected based on particular process steps or other factors. Each of these components may be formed from materials similar to or identical to the materials described with regard to related components of FIG. 2A.

With reference now to the plan views of FIGS. 3B and 3C, at Section B-B, various embodiments of alternate arrangements of the bottom-node leaker device 313 of FIG. 3A are shown. Note that neither FIG. 3B nor FIG. 3C show the top electrode 203, which is not shown merely to prevent obscuring the various examples of formation arrangements of the bottom-node leaker 313. Additionally, as shown, the memory cells of FIG. 3A are formed in a trench.

In a first arrangement 310 of the bottom-node leaker 313, each of the memory cells is shown coupled by a single "line" of material forming the bottom-node leaker 313. Although shown as a single line coupling the memory cells 313, the skilled artisan will recognize, based on reading and understanding the inventive subject matter disclosed herein, that multiple lines of material may be used. Further, the lines need not be formed near the central portion of the memory cells 311 but may be formed at other locations (e.g., such as formed to couple to an "upper" or "lower" edge, with respect to the plan-view drawing, of the memory cells 311). Additionally, as discussed above, not all of the memory cells 311 need to be coupled to each other; only selected ones of the memory cells 311 may be selected to be electrically coupled to the bottom-leaker node 313.

In a second arrangement 320 of the bottom-node leaker 313, each of the memory cells is shown coupled by one more layers of material forming the bottom-node leaker 313. As with FIG. 2C, although shown as a single layer coupling the memory cells 313, the skilled artisan will recognize, based on reading and understanding the inventive subject matter disclosed herein, that multiple layers of material may be used. Each of the layers may comprise the same or different materials from the example materials or other materials discussed above. Further, as discussed above, not all of the memory cells 311 need to be coupled to each other; only selected ones of the memory cells 311 may be selected to be electrically coupled to the bottom-leaker node 313.

Figure 4:
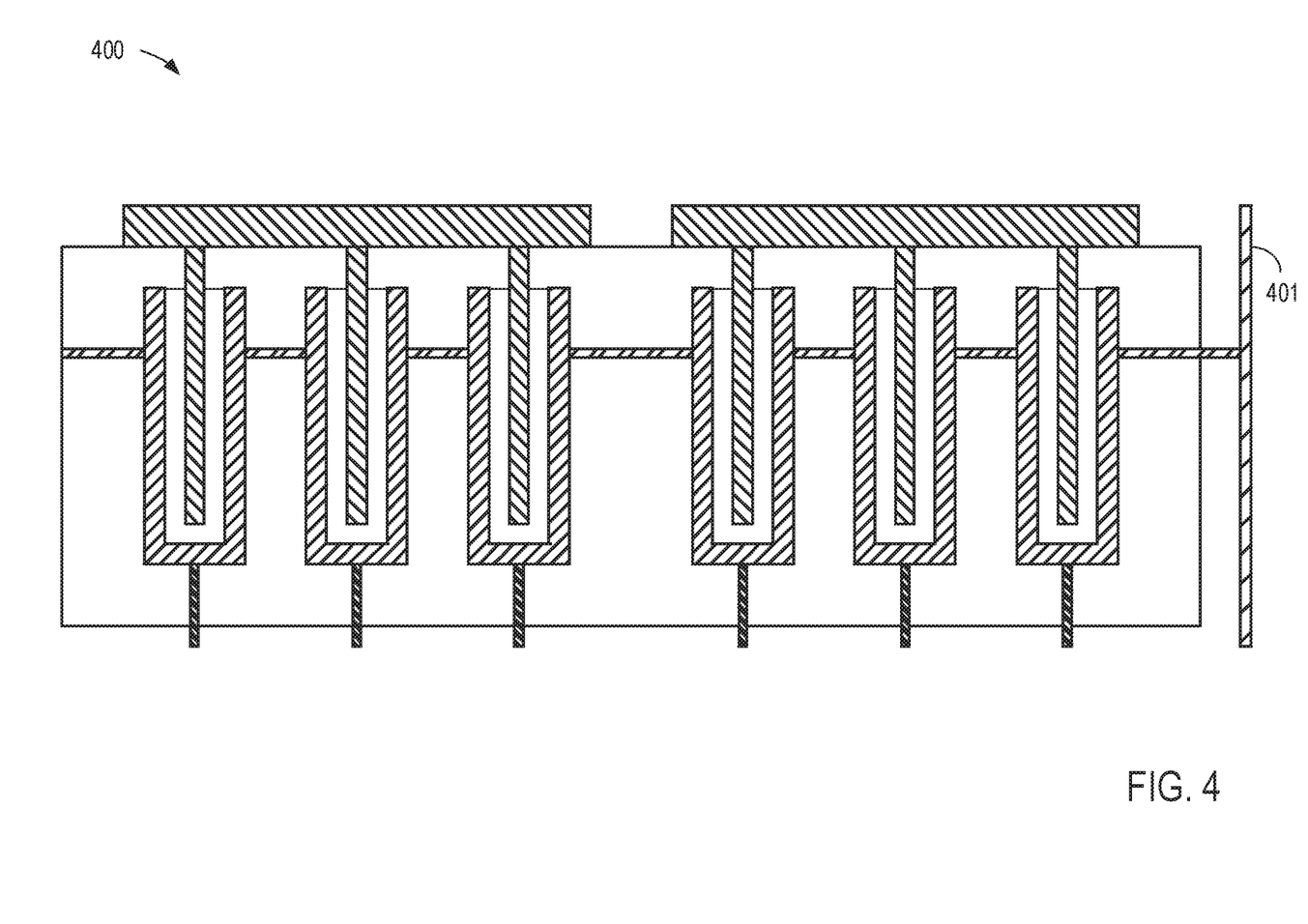
FIG. 4 shows an embodiment of a cross-sectional view of a portion of a memory array, showing a bottom-node leaker device capable of coupling to a substrate to reduce or eliminate excess charge on the bottom electrodes, according the bottom-node leaker device of either FIG. 2A or FIG. 3A.

FIG. 4 shows an embodiment of a cross-sectional view of a portion of a memory array, showing a bottom-node leaker device capable of coupling to a substrate to reduce or eliminate excess charge on the bottom electrodes, according the bottom-node leaker device of either FIG. 2A or FIG. 3A. However. FIG. 4 further indicates an embodiment in which an additional contact line 401 is coupled on a first portion to the bottom-node leaker 213, 313 and coupled on a lower portion to the substrate on which the memory array is formed (not shown) or to another discharge structure (also not shown but understandable the skilled artisan upon reading and understanding the disclosure provided herein). The contact line may be formed from a variety of materials known in the semiconductor industry. The materials may be the same as, or similar to, the material or materials used to form the bottom-node leaker 213, 313. In other embodiments, the contact line 401 may be formed from conductive materials including, but not limited to conductive materials including metals, transition metals, or oxynitrides of these metals used in standard semiconductor fabrication processes such as aluminum (Al), tungsten (W), tantalum (Ta), titanium (Ti), copper (W), platinum (Pt), and others. The contact line 401 may also comprise metal-containing compositions (for instance, metal silicides, metal carbide, etc.), and conductively-doped semiconductor materials (for instance, conductively-doped silicon, conductively-doped germanium, etc.) or various combinations thereof.

The contact line 401 can discharge excess charge from the bottom electrode 205, 305 to the substrate or other discharge structure. As with the discussion associated with either FIG. 2A or FIG. 3A, the bottom-node leaker 213, 313, may couple all or only some selected ones of the memory cells 211, 311, which in turn, are electrically coupled to the contact line 401 and the substrate or other discharge structure.

Figure 5A:
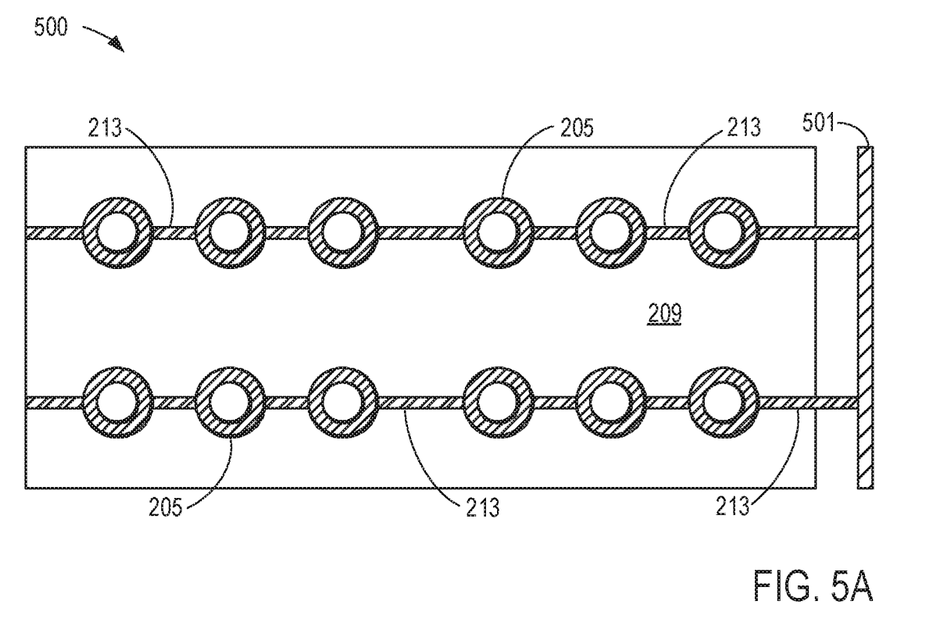
FIGS. 5A and 5B show plan views of embodiments of a memory array incorporating the bottom-node leaker device in accordance with the embodiments shown in FIGS. 2A, 3A, and 4.
Figure 5B:
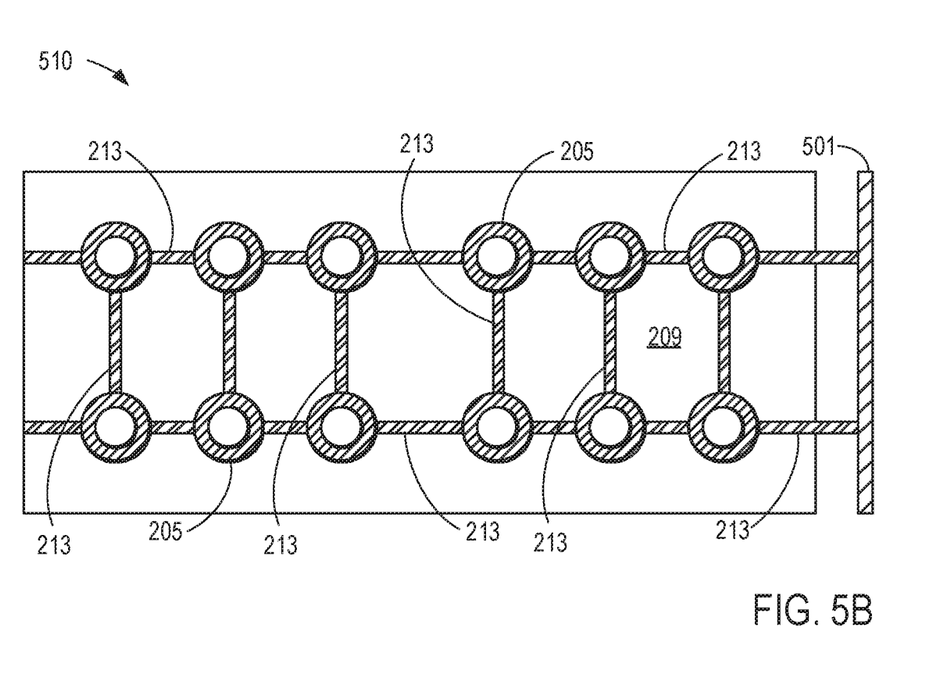

Referring now to FIGS. 5A and 5B, plan views, taken at Section A-A of FIG. 2A, of embodiments of a memory array incorporating the bottom-node leaker device in accordance with the embodiments shown in FIGS. 2A, 3A, and 4 are shown. As noted above, neither FIG. 5A nor FIG. 5B show the top electrode 203 of FIG. 2A. The tope electrode 203 is not shown merely to prevent obscuring the various examples of formation arrangements of the bottom-node leaker 213.

With reference to the first two-dimensional arrangement 500 of memory cells of FIG. 5A, each of the memory cells in this embodiment is coupled to each other within a given row by the bottom-node leaker 213 to an interconnect 501. The interconnect 501, in turn, is coupled to an underlying contact line 401 of FIG. 4 (not shown). The interconnect 501 may be formed from materials similar to or the same as the contact line 401. In various embodiments, the contact line 401 may extend directly down to the substrate or other discharge structure directly from each separate bottom-node leaker line 213, rather than coupling each of the bottom-node leaker 213 lines with the interconnect 501. In various embodiments, not all of the memory cells are coupled to the bottom-node leaker 213.

With reference to the second two-dimensional arrangement 510 of memory cells of FIG. 5B, each of the memory cells in this embodiment is coupled to each other within a given row and across adjacent rows by the bottom-node leaker 213 to an interconnect 501. As with FIG. 5A, the interconnect 501, in turn, is coupled to an underlying contact line 401 (not shown). Also as with FIG. 5A, n various embodiments, the contact line 401 may extend directly down to the substrate or other discharge structure directly from each separate bottom-node leaker line 213, rather than coupling each of the bottom-node leaker 213 lines with the interconnect 501. In various embodiments, not all of the memory cells are coupled to the bottom-node leaker 213, either within a row or across adjacent rows.

Figure 6:
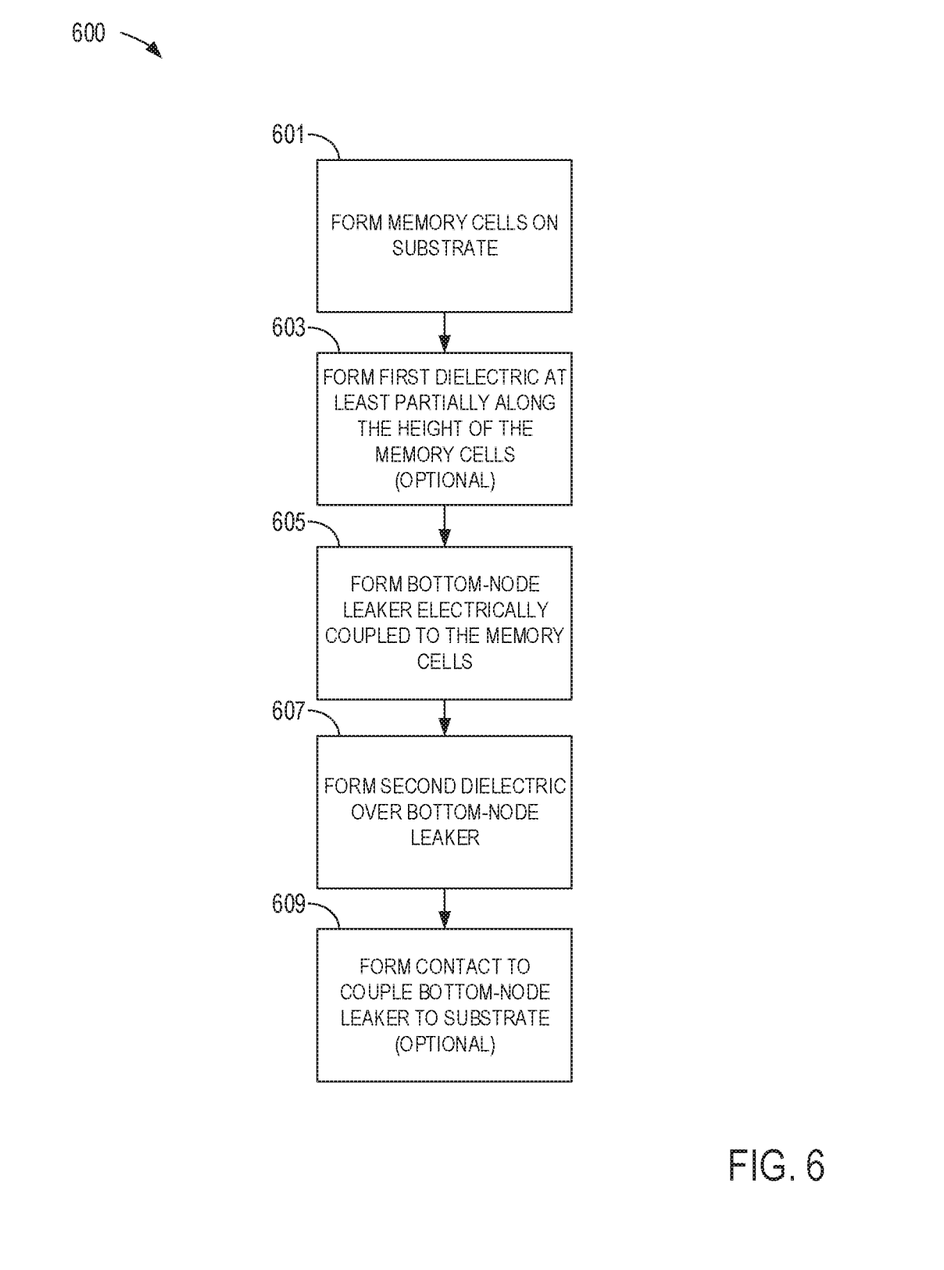
FIG. 6 is an example of a high-level flowchart of a method to fabricate the device in accordance with the embodiments shown in FIGS. 2A, 3A, and 4.

Turning now to FIG. 6, an example of a high-level flowchart of a method to fabricate the device in accordance with the embodiments shown in FIGS. 2A, 3A, and 4 is shown. At operation 601, memory cells are formed on a substrate. As noted above, the memory cells may be fabricated, according to known processes and techniques, as either a plurality of cells formed in a via, a trench, or various other geometries.

At operation 603, first dielectric is formed at least partially along an overall height of the bottom electrode of the memory cells. The first dielectric material may be formed from any of the dielectric materials, or combinations thereof, as discussed above. However, if a subsequently-formed bottom-node leaker is formed at a lowermost portion of the bottom electrode as discussed in conjunction with FIG. 3A, then the first dielectric material may or may not be needed, at least partially depending on how cell bottom-node electrodes are formed (e.g., within the first dielectric material 209, 309 or otherwise formed subsequent to forming buried access devices but prior to forming the first dielectric material).

At operation 605, a bottom-node leaker is formed to electrically couple two or more of the memory cells to each other. The bottom-node leaker may be formed from any of the materials, or combinations thereof, as discussed above. In subsequent operations, the bottom-node leaker may optionally be etched to produce a bottom-node leaker line as described with reference to FIGS. 2B and 3B.

At operation 607, a second dielectric material is formed over the bottom-node leaker. The second dielectric material may be formed from the same material as the first dielectric material. Alternatively, the second dielectric material may be formed from any of the other dielectric materials, or combinations thereof, as discussed above.

At operation 609, a contact line to couple the bottom-node leaker to the substrate or other discharge structure is formed. However, the contact line is optional depending on a level of discharge of the memory cells, and a concomitant cell disturb level, need for a given overall memory array design.

As noted, various ones of the individual process steps are known independently to a person of ordinary skill in the art and may be performed by a number of common fabrication techniques based on the detailed disclosure and material lists provided herein. Further, additional fabrication steps that are known to the skilled artisan, for example, forming the memory cell material with the memory cells and forming electrodes and other related structures, are known in the art and are therefore not described in detail.

Although various embodiments discussed herein use examples relating to a single-bit memory cell for ease in understanding, the inventive subject matter can be applied to numerous multiple-bit schemes as well. For example, each of the memory cells 211, 311 can be programmed to a different one of at least two data states to represent, for example, a value of a fractional bit, the value of a single bit or the value of multiple bits such as two, three, four, or a higher number of bits. The bottom-node leaker 213, 313 may then be utilized to remove or reduce excess charge on walls of the memory cells.

One of ordinary skill in the art may recognize that the memory cells and memory arrays may include other components, at least some of which are discussed herein. However, several of these components are not shown in the figures, so as not to obscure details of the various embodiments described. The memory cells and memory arrays may operate using memory operations (e.g., programming and erase operations) similar to or identical to those known independently in the art.

Based on reading and understanding the disclosure provided herein, a person of ordinary skill in the art may readily extend the techniques and concepts to any number and various arrangements of memory cells. For example, the person of ordinary skill in the art can apply the techniques and concepts to a memory block with hundreds, thousands, or even more memory cells. Thus, many embodiments may be realized.

Figure 7:
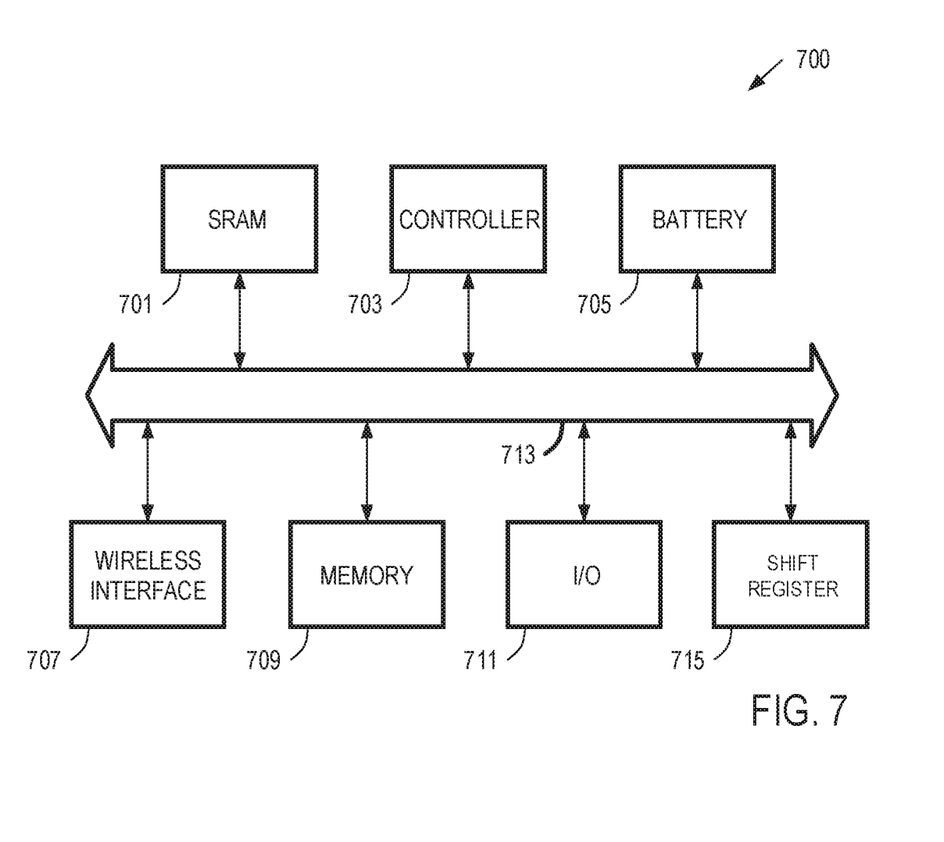
FIG. 7 is a block diagram of a system embodiment, including a memory device.

For example, a system 700 of FIG. 7 is shown to include a controller 703, an input/output (I/O) device 711 (e.g., a keypad, a touchscreen, or a display), a memory device 709, a wireless interface 707, a random access memory (e.g., DRAM or SRAM) device 701, and a shift register 715, coupled to each other via a bus 713. A battery 705 may supply power to the system 700 in one embodiment. The memory device 709 may include a NAND memory, a flash memory, a NOR memory, a combination of these, or the like.

The controller 703 may include, for example, one or more microprocessors, digital signal processors, micro-controllers, or the like. The memory device 709 may be used to store information transmitted to or by the system 700. The memory device 709 may optionally also be used to store information in the form of instructions that are executed by the controller 703 during operation of the system 700 and may be used to store information in the form of user data either generated, collected, or received by the system 700 (such as image data). The instructions may be stored as digital information and the user data, as disclosed herein, may be stored in one section of the memory as digital information and in another section as analog information. As another example, a given section at one time may be labeled to store digital information and then later may be reallocated and reconfigured to store analog information. The controller 703, the memory device 709, and and/or the shift register 715 may include one or more of the novel memory devices described herein.

The I/O device 711 may be used to generate information. The system 700 may use the wireless interface 707 to transmit and receive information to and from a wireless communication network with a radio frequency (RF) signal. Examples of the wireless interface 707 may include an antenna, or a wireless transceiver, such as a dipole antenna. However, the scope of the inventive subject matter is not limited in this respect. Also, the I/O device 711 may deliver a signal reflecting what is stored as either a digital output (if digital information was stored), or as an analog output (if analog information was stored). While an example in a wireless application is provided above, embodiments of the inventive subject matter disclosed herein may also be used in non-wireless applications as well. The I/O device 711 may include one or more of the novel memory devices described herein.

The various illustrations of the methods and apparatuses are intended to provide a general understanding of the structure of various embodiments and are not intended to provide a complete description of all the elements, materials, and features of the apparatuses and methods that might make use of the structures, features, and techniques described herein.

The apparatuses of the various embodiments may include or be included in, for example, electronic circuitry used in high-speed computers, communication and signal processing circuitry, single- or multi-processor modules, single or multiple embedded processors, multi-core processors, data switches, and application-specific modules including multi-layer, multi-chip modules, or the like. Such apparatuses may further be included as sub-components within a variety of electronic systems, such as televisions, cellular telephones, personal computers (e.g., laptop computers, desktop computers, handheld computers, tablet computers, etc.), workstations, radios, video players, audio players, vehicles, medical devices (e.g., heart monitors, blood pressure monitors, etc.), set top boxes, and various other electronic systems.

A person of ordinary skill in the art will appreciate that, for this and other methods (e.g., structure fabrication) disclosed herein, the activities forming part of various methods may be implemented in a differing order, as well as repeated, executed simultaneously, with various elements substituted one for another. Further, the outlined acts and operations are only provided as examples, and some of the acts and operations may be optional, combined into fewer acts and operations, or expanded into additional acts and operations without detracting from the essence of the disclosed embodiments.

The present disclosure is therefore not to be limited in terms of the particular embodiments described in this application, which are intended as illustrations of various aspects. Many modifications and variations can be made, as will be apparent to a person of ordinary skill in the art upon reading and understanding the disclosure. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

Also, as used herein, the term "or" may be construed in an inclusive or exclusive sense. Additionally, although various exemplary embodiments discussed above focus on a 1T1C memory cell, the embodiments are merely given for clarity in disclosure, and thus, are not limited to a 1T1C memory cell or even to memory cells in general.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus, comprising:
multiple electronic devices each having an electrode node and an electrode directly coupled to the electrode node, the electrode nodes of the multiple electronic device at least partially electrically isolated from each other; and
a leaker device including an interconnect line directly coupled to each node of two or more electrode nodes of the multiple electronic devices and configured to discharge at least a portion of excess charge from the two or more electrode nodes.

2. The apparatus of claim 1, wherein the multiple electronic devices comprise a memory array.

3. The apparatus of claim 2, wherein the memory array comprises random access memory cells.

4. The apparatus of claim 3, wherein the random access memory cells comprise ferroelectric random access memory cells.

5. The apparatus of claim 1, further comprising a substrate, wherein the multiple electronic devices are formed upon the substrate, and wherein the interconnect line is electrically coupled to the substrate.

6. The apparatus of claim 1, wherein the leaker device comprises a resistive interconnect including the interconnect line.

7. The apparatus of claim 6, wherein the resistive interconnect comprises the interconnect line and one or more additional interconnect lines each directly coupled to each node of two or more remaining electrode nodes of the multiple electronic devices that are not directly coupled to the interconnect line.

8. The apparatus of claim 6, wherein the resistive interconnect comprises a single layer of material.

9. The apparatus of claim 6, wherein the resistive interconnect comprises multiple layers of material, each layer of the multiple layers being separated from one another by a respective dielectric layer.

10. A method, comprising:
discharging at least a portion of excess charge from two or more electrode nodes of multiple electrode nodes using a leaker device including an interconnect line directly coupled to each of the two or more electrode nodes, the multiple electrode nodes at least partially electrically isolated from each other and each coupled to an electrode of an electronic device of multiple electronic devices.

11. The method of claim 10, further comprising discharging the at least the portion of the excess charge to a discharge structure electrically coupled to the leaker device.

12. The method of claim 11, wherein discharging the at least the portion of the excess charge to the discharge structure comprises discharging the at least the portion of the excess charge to a substrate on which the multiple electronic devices are formed.

13. The method of claim 10, wherein using a leaker device comprises using a resistive interconnect including the interconnect line, the resistive interconnect having a resistance selected to discharge the at least the portion of excess charge from the two or more electrode nodes while not electrically shorting the two or more electrode nodes to one another.

14. The method of claim 10, wherein the multiple electronic devices comprise a memory array, and discharging at least the portion of the excess charge from the two or more electrode nodes comprises discharging at least the portion of the excess charge from the two or more electrode nodes each coupled to an electrode of a memory cell of the memory array.

15. An apparatus, comprising:
multiple electronic devices each having an electrode node and an electrode directly coupled to the electrode node, the electrode nodes of the multiple electronic devices at least partially electrically isolated from each other;
means for discharging at least a portion of the excess charge from the electrode nodes; and
means for electrically coupling the electrode nodes to the means for discharging, including means for directly coupling two or more electrode nodes of multiple electrode nodes to the means for discharging.

16. The apparatus of claim 15, wherein the means for discharging comprises a discharge structure and means for electrically coupling the two or more electrode nodes to the discharge structure.

17. The apparatus of claim 16, wherein the discharge structure comprises a substrate on which the multiple electronic devices are formed.

18. The apparatus of claim 17, wherein the multiple electronic devices comprise a memory array including memory cells formed on the substrate.

19. The apparatus of claim 18, wherein the means for directly coupling two or more electrode nodes of multiple electrode nodes to the means for discharging comprises a resistive interconnect coupled between the two or more electrode nodes and the substrate.

20. The apparatus of claim 19, wherein the resistive interconnect comprises an interconnect line directly coupled between the two or more electrode nodes and the substrate.

* * * * *